United States Patent
Anker et al.

(10) Patent No.: US 11,316,054 B2
(45) Date of Patent: Apr. 26, 2022

(54) PASSIVATED EMITTER AND REAR CONTACT SOLAR CELL

(71) Applicant: Nederlandse Organisatie voor toegepast-natuurwetenschappelijk Onderzoek TNO, The Hague (NL)

(72) Inventors: John Anker, Petten (NL); Evert Eugène Bende, Petten (NL); Lambert Johan Geerligs, Petten (NL); Maciej Krzyszto Stodolny, Petten (NL)

(73) Assignee: Nederlandse Organisatie voor toegepast-natuurwetenschappelijk Onderzoek TNO, 's-Gravenhage (NL)

( * ) Notice: Subject to any disclaimer, the term of this patent is extended or adjusted under 35 U.S.C. 154(b) by 81 days.

(21) Appl. No.: 16/322,124

(22) PCT Filed: Aug. 3, 2017

(86) PCT No.: PCT/NL2017/050518
§ 371 (c)(1),
(2) Date: Jan. 31, 2019

(87) PCT Pub. No.: WO2018/026277
PCT Pub. Date: Feb. 8, 2018

(65) Prior Publication Data
US 2019/0172957 A1    Jun. 6, 2019

(30) Foreign Application Priority Data
Aug. 4, 2016  (NL) ..................... 2017290

(51) Int. Cl.
*H01L 31/0216*    (2014.01)
*H01L 31/18*      (2006.01)
(Continued)

(52) U.S. Cl.
CPC ....... *H01L 31/02167* (2013.01); *H01B 1/023* (2013.01); *H01B 1/16* (2013.01);
(Continued)

(58) Field of Classification Search
CPC .......... H01L 31/02167; H01L 31/0684; H01L 31/068; H01L 31/02245; H01L 31/1868;
(Continued)

(56) References Cited

U.S. PATENT DOCUMENTS 7,468,485 B1 * 12/2008 Swanson ............ H01L 31/0682
136/243
2006/0255340 A1 * 11/2006 Manivannan ........ H01L 31/068
257/79
(Continued)

FOREIGN PATENT DOCUMENTS

CN   101447528 A   6/2009
CN   203760486 U   8/2014
(Continued)

*Primary Examiner* — Michael Y Sun
(74) *Attorney, Agent, or Firm* — N.V. Nederlandsch Octrooibureau

(57) ABSTRACT

Solar cell and method of manufacturing a solar cell. The solar cell has a silicon substrate (2) and a layer (4) disposed on a substrate side (2a) of the silicon substrate (2). It further has a contact structure (6) extending through the layer (4)

(Continued)

Figure 1:
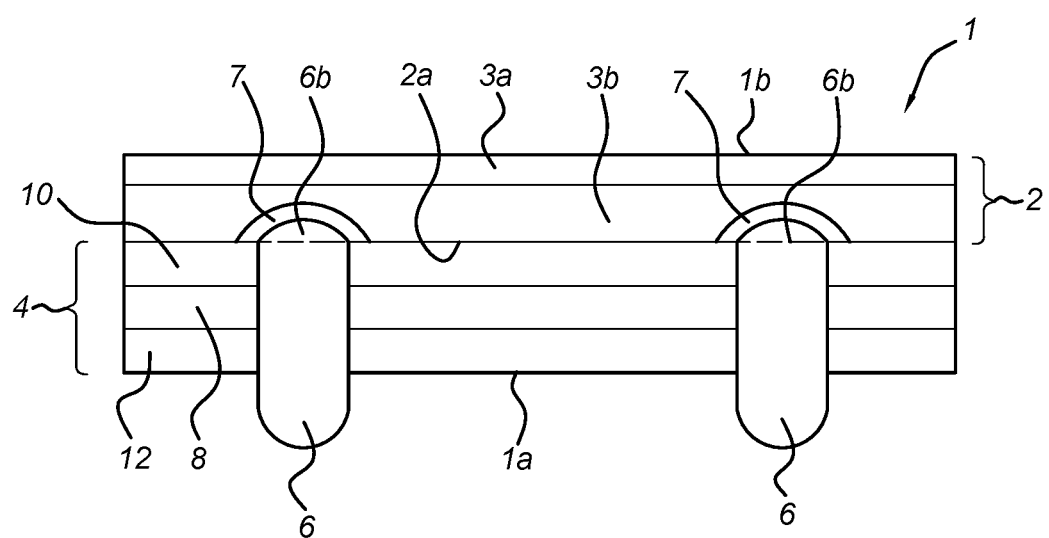

from a cell side (1*a*) of the solar cell (1) to the silicon substrate (2). The layer (4) is composed of a polycrystalline silicon layer (8) and a tunnel oxide layer (10) interposed between the polycrystalline silicon layer (8) and the silicon substrate (2).

11 Claims, 2 Drawing Sheets

(51) Int. Cl.
*H01L 31/068* (2012.01)
*H01L 31/0224* (2006.01)
*H01B 1/02* (2006.01)
*H01B 1/16* (2006.01)

(52) U.S. Cl.
CPC ............ *H01L 31/02245* (2013.01); *H01L 31/022441* (2013.01); *H01L 31/068* (2013.01); *H01L 31/0684* (2013.01); *H01L 31/1804* (2013.01); *H01L 31/1864* (2013.01); *H01L 31/1868* (2013.01); *Y02E 10/547* (2013.01); *Y02P 70/50* (2015.11)

(58) Field of Classification Search
CPC ......... H01L 31/022441; H01L 31/1864; H01L 31/1804; H01B 1/023; H01B 1/16; Y02P 70/50; Y02E 10/547; Y02E 10/546
See application file for complete search history.

(56) References Cited

U.S. PATENT DOCUMENTS

| | | | | |
|---|---|---|---|---|
| 2009/0025786 | A1* | 1/2009 | Rohatgi | H01L 31/1804 |
| | | | | 136/256 |
| 2011/0061732 | A1* | 3/2011 | Yang | H01L 31/0747 |
| | | | | 136/258 |
| 2013/0255765 | A1* | 10/2013 | Gee | H01L 31/032 |
| | | | | 136/256 |
| 2016/0118510 | A1* | 4/2016 | Wu | H01L 31/1804 |
| | | | | 136/256 |
| 2016/0380126 | A1* | 12/2016 | Barkhouse | H01L 31/1804 |
| | | | | 136/256 |
| 2017/0236964 | A1* | 8/2017 | Arima | H01L 31/0508 |
| | | | | 136/244 |

FOREIGN PATENT DOCUMENTS

| | | |
|---|---|---|
| CN | 105185851 A | 12/2015 |
| CN | 204927300 U | 12/2015 |
| WO | 2010123974 A1 | 10/2010 |
| WO | 2012003038 A2 | 1/2012 |

* cited by examiner

PASSIVATED EMITTER AND REAR CONTACT SOLAR CELL

FIELD OF THE INVENTION

The present invention relates to a solar cell, in particular a passivated emitter and rear contact solar cell (PERC). In a further aspect the present invention relates to a method of manufacturing a solar cell, in particular a PERC solar cell.

BACKGROUND ART

International patent application WO2012/003038 discloses a method of manufacturing a solar cell, wherein the method comprises providing an oxide layer on a surface of the substrate and heating the oxide layer in a dry atmosphere at a temperature near or above 900 degrees Celsius to convert the oxide layer to a tunnel dielectric layer of the solar cell.

Chinese patent publication CN 105 185 851 A discloses a back passivation solar cell and a preparation method for the same. The method comprises the steps of (1) texturing, diffusing and etching on a P-type silicon wafer; (2) oxidation on the P-type silicon wafer forming an N-type emitter, and forming a silicon dioxide layer on the front surface and the back surface of the P-type silicon wafer respectively; (3) depositing the silicon dioxide layer on the surface of the silicon dioxide on the back surface by plasma enhanced chemical vapor deposition (PECVD), and then depositing silicon nitride to form a back passivation layer; (4) depositing the silicon nitride on the surface of the silicon dioxide layer on the front surface by PECVD to form a passivation film; and (5) slotting and sintering the back surface of the P-type silicon wafer with the passivation film formed thereon to form a local aluminum back surface field, and then printing the back surface field, a back electrode and a positive electrode.

International patent publication WO 2010/123974 discloses a solar cell of varying composition including a central substrate, conductive layer, an antireflection layer, passivation layer and/or electrode. Multifunctional layers provide combined functions of passivation, transparency, sufficient conductivity for vertical carrier flow, the junction, and/or varying degrees of anti-reflectivity. Improved manufacturing methods including single-side CVD deposition processes and thermal treatment for layer formation and/or conversion are also disclosed.

Chinese utility model publication CN 203 760 486 U discloses a P type crystalline silicon battery where the backlight side of the P type crystalline silicon layer is provided with a tunneling passivation layer, a P+ type crystalline silicon layer and a back electrode in sequence. A PP+ type back electric-field structure is formed at the backlight side of the P type crystalline silicon layer. In the back electric-field structure, due to the tunneling passivation layer, the direct ohmic contact of the back electrode and the P type crystalline silicon layer can be avoided, and due to the back electric-field structure, the surface passivation effect of the backlight side of the P type crystalline crystal layer can be guaranteed, so that the recombination rate of current carriers can be reduced.

SUMMARY OF THE INVENTION

The present invention seeks to provide an improved solar cell, in particular a PERC solar cell, exhibiting improved passivation and a reduced recombination rate.

According to the present invention, a solar cell according to the type defined in the preamble is provided, comprising a silicon substrate and a layer disposed on a substrate side of the silicon substrate, and further comprising a contact structure extending through the layer from a cell side of the solar cell to the silicon substrate, wherein the layer comprises a polycrystalline silicon layer and a tunnel oxide layer interposed between the polycrystalline silicon layer and the silicon substrate.

The solar cell of the present invention, and in particular the layer disposed on a substrate side of the silicon substrate thereof as described above, exhibits improved passivation and yields a reduced recombination current density, thereby increasing the efficiency of the solar cell. The tunnel oxide layer and the polysilicon layer are "firing stable", meaning that higher annealing temperatures can be used for manufacturing the solar cell without degrading the surface passivation. Higher annealing temperatures would also enable thicker Al doping layers. A thicker Al-doping layer causes a lower recombination current Jo of the contact.

SHORT DESCRIPTION OF DRAWINGS

Figure 2:
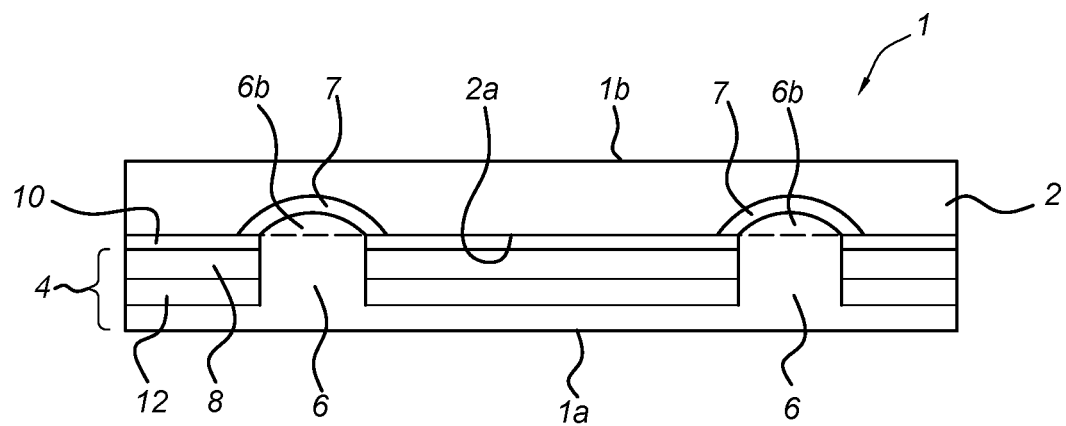
Figure 3:
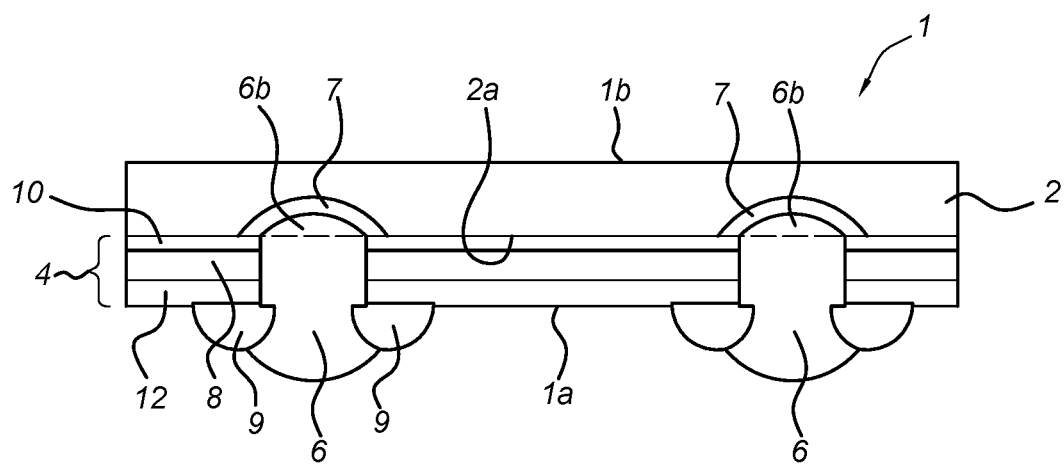

The present invention will be discussed in more detail below, with reference to the attached drawings, in which FIG. 1 shows a cross sectional view of a solar cell according to an embodiment of the present invention;

FIG. 2 shows a cross sectional view of an all-side contact structure according to an embodiment of the present invention; and FIG. 3 shows a cross sectional view of a contact structure having a bounding element according to an embodiment of the present invention.

DESCRIPTION OF EMBODIMENTS

Current passivated emitter and rear contact solar cells (PERC) often comprise a silicon substrate having a PERC passivating layer of aluminium oxide ($Al_2O_3$) or silicon oxide (e.g. $SiO_x$) that is capped with a layer comprising e.g. silicon nitride ($SiN_x$). Such prior art PERC solar cells typically exhibit a recombination pre-factor "$J_0$" of around 10-15 $fA/cm^2$. However, when such a PERC passivating layer is subjected to further annealing or heating steps the recombination pre-factor may increase to 15-40 $fA/cm^2$.

To improve the PERC passivating layer and in particular to further reduce recombination rates of the solar cells, there is a need for a PERC passivating layer which exhibits improved firing stability.

FIG. 1 shows a cross sectional view of a solar cell 1 according to an embodiment of the present invention. In the embodiment shown the solar cell 1 comprises a silicon substrate 2 and a (dielectric) layer 4 disposed on a substrate side 2a of the silicon substrate 2. In a typical embodiment the silicon substrate comprises an emitter layer 3a and a base layer 3b. The silicon substrate 2 may in a further embodiment be a p-type substrate.

The solar cell 1 is further provided with a contact structure 6 extending through the (dielectric) layer 4 from a cell side 1a of the solar cell 1 to the silicon substrate 2. Without loss of generality, in an embodiment the cell side 1a may be envisaged as a rear or back cell side 1a of the solar cell 1 and as such the solar cell 1 then comprises a front cell side 1b.

According to the present invention, the (dielectric) layer 4 comprises a polycrystalline silicon layer 8 and a tunnel oxide layer 10 interposed between the polycrystalline silicon layer 8 and the silicon substrate 2.

In one specific embodiment of the present invention, the polycrystalline silicon layer 8 is an intrinsic layer 8, which should be construed as being a layer that is not intentionally doped and as such is considered to be "undoped" (even though trace amounts of dopants may be present).

The (dielectric) layer 4 of the present invention provides improved firing stability as it allows for higher manufacturing temperatures compared with $Al_2O_3$ or $Al_2O_3$.$SiN_x$.

In an embodiment, the polycrystalline silicon layer 8 is an intrinsic polycrystalline silicon layer, which may be referred to as an "i-poly" layer. The intrinsic polycrystalline silicon layer has also good passivation properties. In a further embodiment, the polycrystalline silicon layer 8 has a thickness between 5-300 nm. It was seen in experimental results, that for this range improved performance could be obtained. It is noted that the polycrystalline silicon layer 8 may be regarded as intrinsic, when the layer has a net (p-type or n-type) dopant of less than $10^{17}$ atoms/$cm^3$).

Especially when the doping is light (e.g. less than $10^{17}$ atoms/$cm^3$), the advantageous characteristics of the present invention embodiments are still present. It is noted that, depending on the amount of dopant present, the layer 4 may then strictly no longer be classified as a dielectric layer 4. It has been found that if the polycrystalline silicon layer 8 is intrinsic or only lightly doped, it does not act as a conductor, neither for a leakage current nor for lateral transport. The combination of tunnel oxide layer 10 and the polycrystalline silicon layer 8 at the same time exhibits a very good surface passivation.

In an even further embodiment, the polycrystalline silicon layer 8 is a p-doped silicon layer. If e.g. the polycrystalline silicon layer 8 has an average p+ doping level typically above $>5*10^{18}$ $cm^{-3}$, the polycrystalline silicon layer 8 can laterally conduct carriers towards the contact structure 6. Because of this the doping level in the substrate 2 might be chosen lower. This has a positive side effect because Light Induced Degradation caused by Boron-Oxygen complexes is then reduced. Drawback of this embodiment is that the deposition time is longer than for the intrinsic variant of the polycrystalline silicon layer 8, in case the p+ dopant is realized in situ (in the LPCVD), or that an additional diffusion step (BBr3 or Br ion implant) has to be realized after the polycrystalline silicon layer 8 deposition.

During experiments (with a polycrystalline silicon layer 8 between 5 and 300 nm thickness, see above) it was found that after a firing step (annealing step) at a peak temperature of 710° C. and 750° C. degrees Celsius measured on samples with a thermocouple, the implied open circuit voltage $V_{oc}$ of the semi product (i.e. an unmetallized solar cell) 1 according to the present invention embodiments having e.g. an intrinsic polycrystalline silicon layer was 730 mV and 715 mV, respectively. On the other hand, a prior art PERC unmetallized solar cell 1 having a dielectric layer merely comprising $Al_2O_3$ exhibited an implied open circuit voltage $V_{oc}$ between 710 mV-655 mV. Furthermore, a prior art PERC solar cell having a dielectric layer only comprising $Al_2O_3$ and $SiN_y$:H exhibited an implied open circuit voltage $V_{oc}$ of 710 mV and 660 mV, respectively. Consequently, the unmetallized solar cell 1 of the present invention embodiments showed a markedly higher implied open source voltage $V_{oc}$ and less degradation with increasing temperature in actual experimentation compared to other prior art PERC solar cells.

As mentioned earlier, the polycrystalline silicon layer 8 may be an intrinsic polycrystalline layer. Such a layer 8 may be obtained starting from an amorphous silicon layer provided as a precursor onto the tunnel oxide layer 10, after which a temperature cycle (annealing) is applied to provide the polycrystalline silicon layer 8. Alternatively, the polycrystalline silicon layer 8 is directly obtained using e.g. an LPCVD (Low Pressure Chemical Vapor Deposition) process.

In an embodiment, the tunnel oxide layer 10 has a thickness between 0.5-2.5 nm and may in further embodiments be applied as a thermal oxide or a wet chemical oxide.

According to a further embodiment, the layer 4 of the present invention comprises a hydrogen providing capping layer 12 disposed on the polycrystalline silicon layer 8, providing good passivation for e.g. the tunnel oxide layer 10. In an exemplary embodiment, the capping layer 12 may comprise aluminium oxide ($Al_2O_3$) or silicon nitride ($SiN_y$) or any combination thereof. In a further embodiment, the capping layer 12 has a thickness of about 4-200 nm.

In an embodiment, the contact structure 6 of the solar cell 1 may be an aluminium based contact structure 6 for providing good electrical conductivity and Ohmic contact with the silicon substrate 2, but also for lowering cost and allowing for convenient processing steps during manufacturing. In an advantageous embodiment, as depicted in FIG. 1, the contact structure 6 may comprise an aluminium silicon alloy layer 6b and a p+ doped silicon layer 7 interfacing with the silicon substrate 2, thereby providing good electrical contact between the (aluminium based) contact structure 6 and the silicon substrate 2. In an even further embodiment, an aluminium based contact structure 6 may comprise boron and/or silicon, so that e.g. an improved p+ doped silicon layer 7 is provided as a back surface field (BSF) on a p-type substrate 2 or as an emitter on a n-type substrate 2 for reducing recombination between the aluminium silicon alloy layer 6b and the silicon substrate 2. It is noted that an aluminium based contact structure 6 obtained by alloying aluminium paste and silicon in itself can already provide a p+ doped silicon layer 7. Additional boron and/or silicon can improve the alloying physics and/or the p+ dopant passivation quality.

As depicted in FIG. 1, the contact structure 6 need not cover an entire cell side 1a, e.g. a back cell side 1a of the solar cell 1, and can therefore be applied advantageously in bi-facial solar cell applications. FIG. 2 on the other hand shows a cross sectional view of an embodiment of a contact structure 6 fully covering the cell side 1a, e.g. back cell side 1a, of the solar cell 1. Note that an emitter layer and a base layer of the silicon substrate 2 have not been drawn explicitly in FIG. 2 for clarity purposes.

FIG. 3 depicts a cross sectional view of a contact structure 6 having a bounding element 9 according to an embodiment of the present invention. In this embodiment the layer 4 as described above with reference to the FIGS. 1 and 2 embodiment is also present, comprising the tunnel oxide layer 10 disposed on the substrate side 2a and interposed between the silicon substrate 2 and the polycrystalline silicon layer 8 (e.g. an intrinsic polycrystalline silicon layer). The polycrystalline silicon layer 8 may again optionally be covered with a capping layer 12 (e.g. $Al_2O_3$, $SiN_x$). In the embodiment shown in FIG. 3, the solar cell 1 further comprises the bounding element 9 arranged along edges of the contact structure 6. The use of such a bounding element 9 provides a relatively small aperture or opening through the layer 4 for creation of e.g. a p+ doped silicon layer 7 and an aluminium silicon alloy layer 6b in the silicon substrate 2.

The bounding element 9 also prevents contact of e.g. an aluminium based contact structure 6 with the layer 4, thereby avoiding degradation of passivating properties of said layer 4 and allow for a further reductions of surface recombination. This is of particular importance in case e.g.

an aluminium based paste is used for manufacturing an aluminium based contact structure 6 using a "firing through" paste with etchant particles.

In an embodiment, the bounding element 9 consists of non-contacting, non-firing-through paste. The non-firing-through property allows that the paste will not dissolve the underlying layer 4. The paste is also non contacting, i.e. not providing electrical contact with an underlying layer.

In a further embodiment, the bounding element 9 may be characterized as an inert material with respect to the layer 4 and to the contact structure 6, e.g. an aluminium based contact structure 6. As such the bounding element 9 does not react with the layer 4 or the silicon substrate 2 at annealing temperatures between e.g. 577° C. and 800° C. degrees Celsius.

In a group of further embodiments the bounding element 9 comprises aluminium-oxide particles or aluminium particles coated with an aluminium oxide, or the bounding element 9 comprises an aluminium oxide or aluminium nitride based material.

In a further aspect, the present invention relates to a method of manufacturing a solar cell 1, wherein the solar cell 1 obtained exhibits improved passivation and reduced recombination rates. FIGS. 1 to 3 can be used as a reference.

The method comprises the step of a) providing a silicon substrate 2, wherein the silicon substrate 2 may be a p-type or n-type substrate depending on requirements. The method then comprises the step of b) depositing a tunnel oxide layer 10 on a substrate side 2a of the silicon substrate 2 followed by the method step of c) depositing a polycrystalline silicon layer 8 on the tunnel oxide layer 10. In the embodiments depicted, the tunnel oxide layer 10 is typically deposited on a base/bulk layer 3b of the silicon substrate 2, see e.g. FIG. 1.

The method further comprises d) providing a contact structure 6 extending from a cell side 1a of the silicon substrate 2 through the polycrystalline silicon layer 8 and the tunnel oxide layer 10 to the silicon substrate 2.

According to the present invention, the solar cell 1 obtained through the present method exhibits, as outlined above, improved passivation and reduced recombination rates. Furthermore, experiments have shown that higher implied open circuit voltages $V_{oc}$ may be expected, e.g. between 715 mV and 730 mV, compared to prior art PERC solar cells showing open circuit voltages $V_{oc}$ between 655 mV and 715 mV.

In an embodiment, the step of b) depositing the tunnel oxide layer 10 may comprise depositing a thermal oxide or a wet chemical oxide layer.

Also, in a further embodiment the step of c) depositing the polycrystalline silicon layer 8 may further comprise depositing an intrinsic poly crystalline layer or an intrinsic polycrystalline silicon layer. The depositing step c) may be performed through known methods such as chemical vapour deposition (CVD), LP-CVD (low pressure CVD) or PE-CVD (plasma enhanced CVD).

In an embodiment, the method of the present invention comprises the step of heating the silicon substrate 2, the tunnel oxide layer 10 and the polycrystalline silicon layer 8. Good results have been obtained at a peak temperature of 710° C. and 750° C. (see experiments described above). This step may be performed as e.g. a firing step or annealing step for finalising the contact structure 6. It is noted that finalising the contact structure 6 may require a heating to a temperature higher than 660° C., i.e. the melting temperature of aluminium. For example, an aluminium based paste may be used for the method step of d) providing a contact structure 6. By annealing the aluminium based paste, optionally comprising boron and optionally comprising silicon, an aluminium silicon alloy layer 6b may be formed as well as a back surface field layer 7. It is noted that finalising the contact structure 6 may require, if it comprises aluminium and Silicon, a heating to a temperature higher than 577° C., i.e. the eutectic temperature of the Al—Si alloy. Advantageously, because the (dielectric) layer 4 comprises the tunnel oxide layer 10 and the polycrystalline silicon layer 8, which is more firing stable, allows to use a higher heating temperature, which in turn allows a thicker p+ doping layer 7 resulting in a lower recombination current density.

In further detailed embodiments of the method, in an embodiment the method step of a) providing the silicon substrate 2 may further comprise texturizing the silicon substrate 2 creating an n+ doping layer utilizing e.g. $POCl_3$, followed by selectively etching a front cell side 1b of the solar cell 1, and then depositing an antireflection coating (e.g. $SiN_x$).

In a further embodiment, the method step of b) depositing a tunnel oxide layer 10 may comprise nitric acid oxidation (NAOS) of the substrate side 2a of the silicon substrate 2.

In yet another embodiment, the method step of c) depositing the polycrystalline silicon layer 8 on the tunnel oxide layer 10 may comprise a subsequent step of depositing a capping layer 12 onto the polycrystalline silicon layer 8, such as an $SiN_x$ layer or an $Al_2O_3$ layer.

In a further embodiment, the method comprises opening the capping layer 12 by a laser or by a chemical etching paste.

Depositing the polycrystalline silicon layer 8 onto the tunnel oxide layer 10 may, however, also result in an intrinsic layer being simultaneously deposited on an opposite cell side 1b, such as a front cell side 1b of the solar cell 1. As a result, it may be needed to remove such a front cell side intrinsic layer. To that end the method of the present invention may further comprise the step of alkaline etching (e.g. potassium hydroxide etching (KOH)) of an intrinsic layer from a front cell side 1b of the solar cell 1. Note that it is not strictly required to remove such an intrinsic layer from a front cell side 1b of the solar cell 1 and skipping this method step reduces the number of processing steps and associated costs.

As an additional step to producing the solar cell 1, a further contact structure may be deposited on an opposite cell side 1b, such as a front contact structure of silver (Ag). The further contact structure need not be fully completed in this step but may be provided as initial dikes or ridges. This step may be performed before the method step of providing the contact structure 6. Once the contact structure 6 has been provided by means of a firing-through aluminium based paste, the method may then continue by completing the front contact structure. Alternatively, the front and back side structures are provided using co-firing steps.

It is noted that in the formation of the contact structure 6 (including p+ doped silicon layer 7) for the above described embodiments, both the polycrystalline silicon layer 8 and the silicon material from the substrate 2 are involved.

The firing process e.g. starts with the burning out of organic solvents from the paste. Aluminum oxide shells of the particles in the paste are thickened due to high temperatures and an oxygen containing atmosphere. The particle matrix is therefore stabilized and not destroyed during the firing process. At 660° C. aluminum melts and dissolves silicon from the surface (i.e. first from the polycrystalline layer 8 and then from the silicon substrate 2) to form a liquid Al—Si-phase with a temperature dependent percentage of silicon according to the liquidus curve L(T) of the phase diagram. Silicon diffuses via small interconnections into the particles and Al diffuses to the wafer surface where a volume of liquid Al—Si phase is built. The silicon content in the liquid phase on the wafer surface and in the particles increases at higher temperatures. At a peak temperature, the maximum concentration of silicon in the liquid phase and so the maximum amount of dissolved silicon is reached. Therefore the weight of dissolved silicon $m_{Si,dis}$ and the corresponding thickness $d_{Si,dis}$ can be calculated with the weight of deposited aluminum $m_{Al}$ according to:

$$d_{Si,dis} = \frac{m_{Si,dis}}{A\rho_{Si}} = \frac{m_{Al}}{A\rho_{Si}} \times \frac{L(T_{peak})}{100 - L(T_{peak})}$$

where A is the (homogeneously) printed area, psi the density of silicon and L(Tpeak) the percentage of Si in the liquid Al—Si-phase at peak temperature Tpeak. While cooling down, Si is rejected from the liquid phase and crystallizes at the liquid-phase/silicon interface. According to the solid solubility, which decreases with falling temperature in the relevant temperature range, Al atoms are incorporated into the Si lattice. This means that the peak doping concentration is situated at the former liquid-phase/silicon interface with decreasing doping concentrations in direction to the final surface of the p+-layer. When the eutectic temperature of Teut=577° C. is reached, the remaining liquid phase solidifies in a short time. The silicon percentage of this mixture is still relevant (theoretical eutectic composition with 12.6 wt % Si). Between the surface of the p+-layer and the paste matrix remains therefore the so-called "eutectic layer" with a compact structure of nearly pure aluminum and about 12.6 Wt % silicon in the typical lamella structure of eutectic alloys. The porous layer of paste particles at the outer surface (paste residuals) consists of a solid Al—Si mixture as well.

For the present invention embodiments, an exemplary process flow would be to sequentially provide the tunnel oxide layer 10, polycrystalline silicon layer 8, and capping layer 12. Openings are then provided in the capping layer 12 where needed for the contact structure 6, and aluminum paste is printed and then fired as described in the previous paragraph. By opening the capping layer 12 only where needed, less etching glass frit is needed, which is beneficial for the recombination rate of the p+ doped silicon layer 7 thus formed.

The present invention has been described above with reference to a number of exemplary embodiments as shown in the drawings. Modifications and alternative implementations of some parts or elements are possible, and are included in the scope of protection as defined in the appended claims.

The invention claimed is:

1. A solar cell, comprising a silicon substrate and a layer disposed on a substrate side of the silicon substrate, and further comprising a contact structure extending through the layer from a cell side of the solar cell to the silicon substrate,
    wherein the layer comprises a polycrystalline silicon layer and a tunnel oxide layer interposed between the polycrystalline silicon layer and the silicon substrate, and the tunnel oxide layer is in direct contact with the silicon substrate;
    wherein the polycrystalline silicon layer is an intrinsic polycrystalline silicon layer.

2. The solar cell according to claim 1, wherein the polycrystalline silicon layer has a thickness between 5-300 nm.

3. The solar cell according to claim 1, wherein the tunnel oxide layer comprises a thermal oxide or a wet chemical oxide.

4. The solar cell according to claim 1, wherein the tunnel oxide layer has a thickness between 0.5-2.5 nm.

5. The solar cell according to claim 1, wherein the layer further comprises a hydrogen providing capping layer disposed on the polycrystalline silicon layer.

6. The solar cell according to claim 5, wherein the capping layer comprises aluminium oxide or silicon nitride.

7. The solar cell according to claim 5, wherein the capping layer has a thickness of 4-200 nm.

8. The solar cell according to claim 1, wherein the contact structure is an aluminium based contact structure.

9. The solar cell according to claim 8, wherein the aluminium based contact structure comprises boron and/or silicon.

10. The solar cell according to claim 1, wherein the contact structure comprises an aluminium-silicon alloy layer and a p+ doped silicon layer interfacing with the silicon substrate.

11. The solar cell according to claim 1, wherein the contact structure extends entirely through the thickness of the polycrystalline silicon layer and the thickness of the tunnel oxide layer.

* * * * *